(12) United States Patent
Yeh et al.

(10) Patent No.: US 11,523,495 B1
(45) Date of Patent: Dec. 6, 2022

(54) MULTILAYER PCB STRUCTURE WITH INNER THERMALLY CONDUCTIVE MATERIAL, OPTICAL COMMUNICATION MODULE HAVING THE SAME AND METHOD OF FABRICATING THE SAME

(71) Applicant: Prime World International Holdings Ltd., New Taipei (TW)

(72) Inventors: Che-Shou Yeh, New Taipei (TW); Ling-An Kung, New Taipei (TW); Cheng-Ta Tsai, New Taipei (TW); Shih-Cheng Lin, New Taipei (TW)

(73) Assignee: Prime World International Holdings Ltd., New Taipei (TW)

( * ) Notice: Subject to any disclaimer, the term of this patent is extended or adjusted under 35 U.S.C. 154(b) by 0 days.

(21) Appl. No.: 17/412,169

(22) Filed: Aug. 25, 2021

(51) Int. Cl.
*H05K 1/02* (2006.01)
*H05K 3/46* (2006.01)
*H05K 1/18* (2006.01)
*H05K 3/40* (2006.01)

(52) U.S. Cl.
CPC .......... *H05K 1/0206* (2013.01); *H05K 1/181* (2013.01); *H05K 3/4038* (2013.01); *H05K 3/4644* (2013.01); *H05K 2201/10121* (2013.01)

(58) Field of Classification Search
CPC .. H05K 1/0206; H05K 3/4038; H05K 3/4644; H05K 2201/10121
See application file for complete search history.

(56) References Cited

U.S. PATENT DOCUMENTS 10,433,413 B2 * 10/2019 Yu .................. H05K 3/4644
2016/0050771 A1 * 2/2016 Yu .................. H05K 3/429
29/852

* cited by examiner

*Primary Examiner* — Sherman Ng
(74) *Attorney, Agent, or Firm* — Grossman Tucker Perreault & Pfleger, PLLC (57) ABSTRACT

A multilayer PCB structure includes a core layer, a first layer on a first surface of the core layer, a second layer on a second surface of the core layer, and a thermally conductive material in the core layer. The first surface and the second surface of the core layer are opposite to each other, and a window is formed on the second layer by removing part of the second layer. The window of the second layer exposes part of the core layer below the thermally conductive material.

12 Claims, 7 Drawing Sheets

MULTILAYER PCB STRUCTURE WITH INNER THERMALLY CONDUCTIVE MATERIAL, OPTICAL COMMUNICATION MODULE HAVING THE SAME AND METHOD OF FABRICATING THE SAME

BACKGROUND

1. Technical Field

The present disclosure relates to optical communication, more particularly to a multilayer printed circuit board (PCB) structure used in an optical communication module.

2. Related Art

Optical transceivers are generally installed in electronic communication facilities in modern high-speed communication networks. In order to make flexible the design of an electronic communication facility and less burdensome the maintenance of the same, an optical transceiver is inserted into a corresponding cage that is disposed in the communication facility in a pluggable manner. In order to define the electrical-to-mechanical interface of the optical transceiver and the corresponding cage, different form factors such as XFP (10 Gigabit Small Form Factor Pluggable) used in 10 GB/s communication rate, QSFP (Quad Small Form-factor Pluggable), or others at different communication rates have been made available.

As to the optical components in a conventional optical transceiver, a circuit board is disposed in a housing, and a TOSA (Transmitter optical sub-assembly) as well as a ROSA (Receiver optical sub-assembly) are mounted on the circuit board.

BRIEF DESCRIPTION OF THE DRAWINGS

The present disclosure will become more fully understood from the detailed description given below and the accompanying drawings which are given by way of illustration only and thus are not intending to limit the present disclosure and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1:
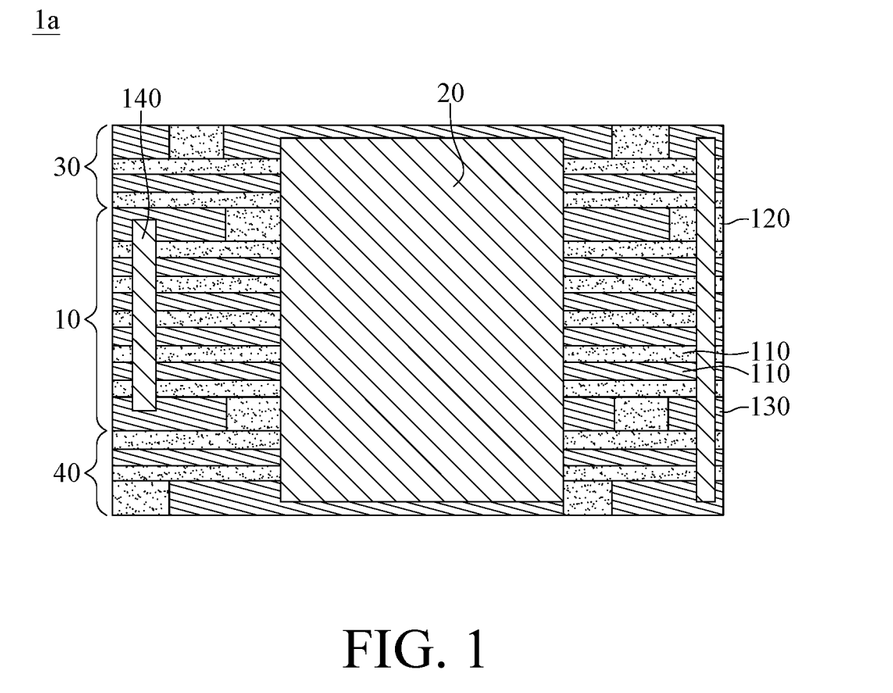
FIG. 1 is a schematic view of a multilayer PCB structure according to one embodiment of the present disclosure.

Please refer to FIG. 1 which is a schematic view of a multilayer PCB structure according to one embodiment of the present disclosure. In this embodiment, a multilayer PCB structure 1a may include a core layer 10, a thermally conductive material 20, a top layer 30 and a bottom layer 40. The core layer 10 includes one or more sub-layers 110, a top circuit pattern 120, a bottom circuit pattern 130 and a conductive via 140. The top circuit pattern 120 and the bottom circuit pattern 130 are formed on respective sub-layers 110 at opposite sides of the core layer 10, and the conductive via 140 is provided to connect the top circuit pattern 120 with the bottom circuit pattern 130. The top layer 30 and the bottom layer 40 are formed at the opposite sides of the core layer 10, respectively. An empty space is defined by the core layer 10, the top layer 30 and the bottom layer 40, and the thermally conductive material 20 is filled in the empty space.

Figure 2:
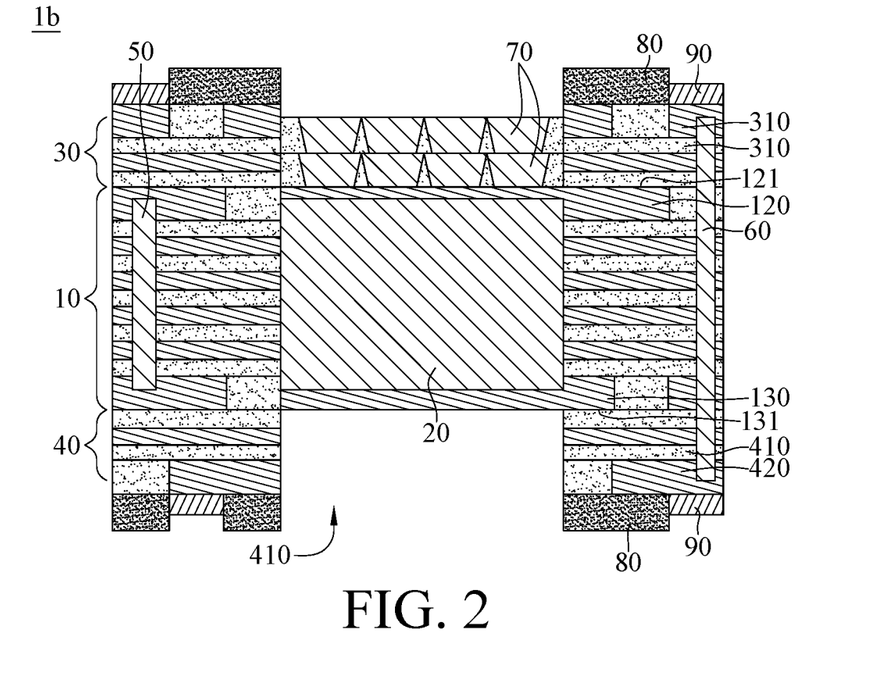
FIG. 2 is a schematic view of a multilayer PCB structure according to another embodiment of the present disclosure.

FIG. 2 is a schematic view of a multilayer PCB structure according to another embodiment of the present disclosure. In this embodiment, a multilayer PCB structure 1b may include a core layer 10, a thermally conductive material 20, a top layer 30, a bottom layer 40, two conductive vias 50 and 60.

The core layer 10 includes one or more sub-layers 110, a top circuit pattern 120 and a bottom circuit pattern 130. The top circuit pattern 120 and the bottom circuit pattern 130 are formed on respective sub-layers 110 at opposite sides of the core layer 10, and the conductive via 50 is provided to connect the top circuit pattern 120 with the bottom circuit pattern 130. The top layer 30 and the bottom layer 40 are formed on the opposite sides of the core layer 10, respectively. The conductive via 60 is provided to connect the top layer 30 with the bottom layer 40. An empty space is defined by the core layer 10, and the thermally conductive material 20 is filled in the empty space. The bottom layer 40 includes a window 410 exposing part of the bottom circuit pattern 130 below the thermally conductive material 20. The thermally conductive material 20 may be a metal block such as copper or aluminum. Each of the top layer 30 and the bottom layer 40 may include one or more sub-layers 310 and 420. The sub-layers 110, 310 and/or 420 may be a lamination of prepreg films and metal films.

The multilayer PCB structure 1b may include one or more thermal vias 70. The thermal via 70 is located in the top layer 30, and the thermal via 70 is in thermal contact with the thermally conductive material 20 through the top circuit pattern 120 of the core layer 10. Also, the multilayer PCB structure 1b may include two solder masks 80 and two metal films 90. The two solder masks 80 are formed on the top layer 30 and the bottom layer 40, respectively. One of the metal films 90 is formed on the top layer 30, and another metal film 90 is formed on the bottom layer 40.

Figure 3:
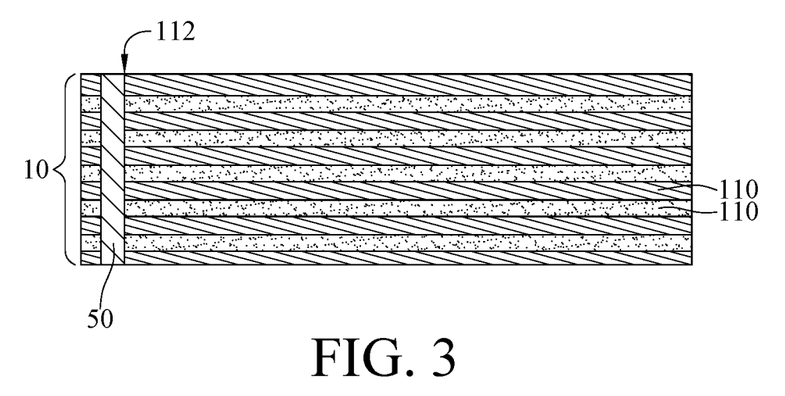
FIG. 3 through FIG. 12 are schematic views showing fabrication of the multilayer PCB structure in FIG. 2.

The following is a method of fabricating the multilayer PCB structure 1b in FIG. 2. Please refer to FIG. 3 through FIG. 12 which are schematic views showing fabrication of the multilayer PCB structure in FIG. 2. As shown in FIG. 3, the conductive via 50 is formed in the core layer 10. In this embodiment, the core layer 10 may be drilled to form a through hole 112; then, metal (such as copper) is deposited in the through hole 112 to form the conductive via 50.

Figure 4:
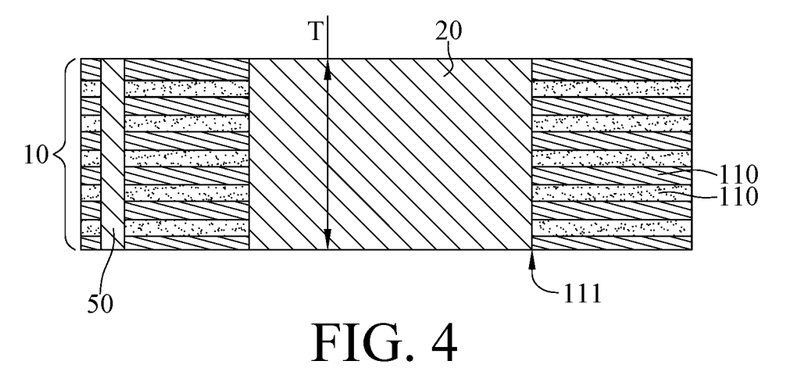

As shown in FIG. 4, the thermally conductive material 20 is formed in the core layer 10. In this embodiment, the core layer 10 may be drilled to form the empty space 111, and metal (such as copper) is deposited in the empty space 111 to form the thermally conductive material 20. The thermally conductive material 20 and the conductive via 50 may have substantially the same thickness T in this embodiment.

Figure 5:
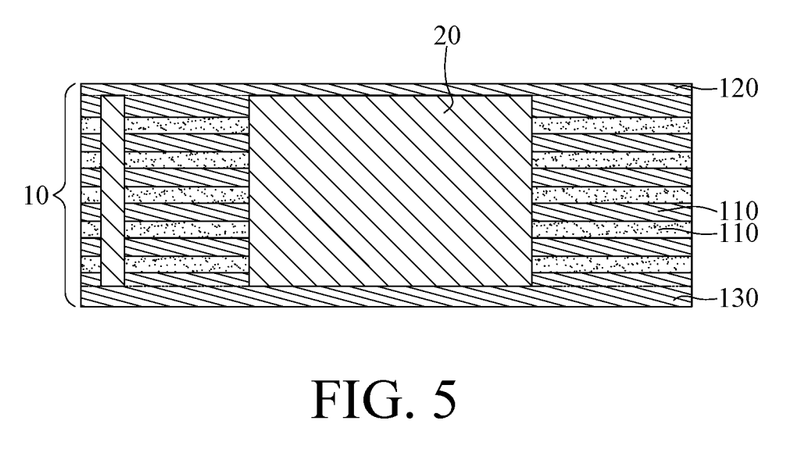

As shown in FIG. 5, the top circuit pattern 120 and the bottom circuit pattern 130 of the core layer 10 are formed on opposite sides. In this embodiment, two metal sub-layers are deposited on respective outmost sub-layers 110 at opposite sides of the core layer 10, and each of the deposited metal sub-layers is taken as the top circuit pattern 120 or the bottom circuit pattern 130, or alternatively, is partially removed by etching process to form the top circuit pattern 120 or the bottom circuit pattern 130. The top circuit pattern 120 and the bottom circuit pattern 130 cover opposite surfaces of the thermally conductive material 20, respectively.

Figure 6:
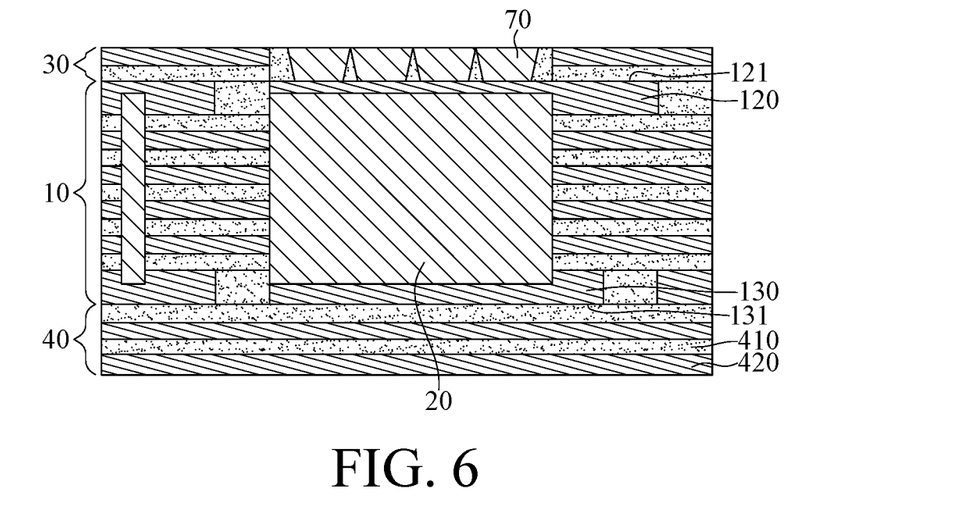
Figure 7:
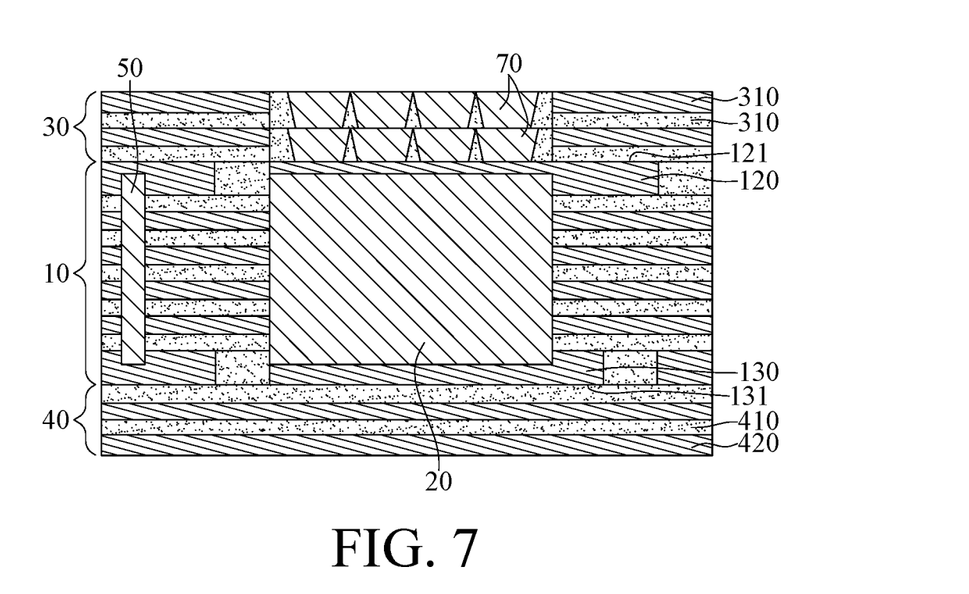

As shown in FIG. 6 and FIG. 7, the top layer 30 is formed on a top surface 121 of the core layer 10, and the bottom layer 40 is formed on a bottom surface 131 of the core layer 10. In this embodiment, the top circuit pattern 120 has the top surface 121, and the bottom circuit pattern 130 has the bottom surface 131 opposite to the top surface 121. The top layer 30 including the sub-layers 310 is laminated on the top surface 121, and the bottom surface 40 including the sub-layers 420 is laminated on the bottom surface 131.

One or more thermal vias 70 are formed in the top layer 30. In this embodiment, after some sub-layers 310 of the top layer 30 are laminated on the core layer 10, these sub-layers 310 are drilled, and metal (such as copper) is deposited in the drilled holes to form some thermal vias 70. The thermal via 70 may be a metal pillar filling the drilled hole, or a metal film coated on the inner wall of the drilled hole. After the rest sub-layers 310 are laminated on the core layer 10, these sub-layers 310 are drilled, and metal (such as copper) is deposited in the drilled holes to form some other thermal vias 70 above the aforementioned thermal vias 70. In other words, the thermal vias 70 are provided by high density interconnect (HDI) in this embodiment. The thermal vias 70 are in thermal contact with the top circuit pattern 120 of the core layer 10. It is worth noting that the arrangement of thermal via 70 is not limited by embodiments discussed in the present disclosure.

Figure 8:
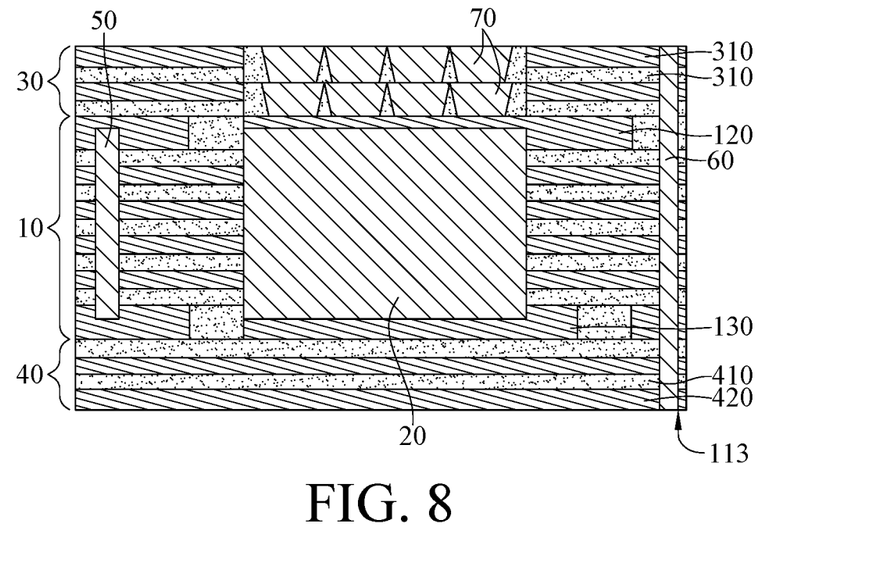

As shown in FIG. 8, the conductive via 60 is formed in the core layer 10, the top layer 30 and the bottom layer 40. In this embodiment, the core layer 10 may be drilled to form a through hole 113; then, metal (such as copper) is deposited in the through hole 113 to form the conductive via 60. The conductive via 60 extends through the core layer 10 and into the top layer 30 and the bottom layer 40.

Figure 9:
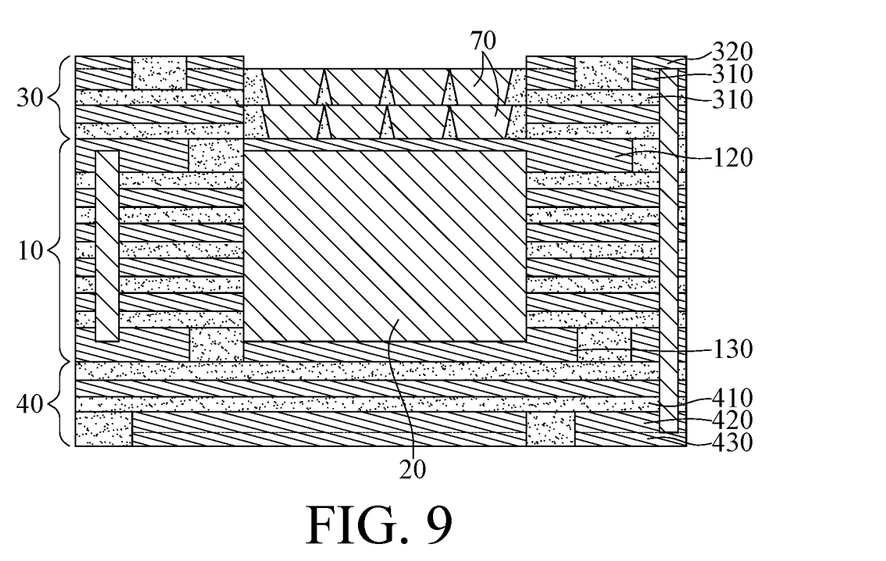

As shown in FIG. 9, a top circuit pattern 320 of the top layer 30 is formed, and a bottom circuit pattern 430 of the bottom layer 40 is formed. In this embodiment, two metal sub-layers are deposited on the outmost sub-layer 310 and the outmost sub-layer 420, respectively; then, each of the deposited metal sub-layers is then partially removed by etching process to form the top circuit pattern 320 and the bottom circuit pattern 430. Both the top circuit pattern 320 and the bottom circuit pattern 430 do not overlap the thermally conductive material 20, and also not overlap the thermal vias 70.

Figure 10:
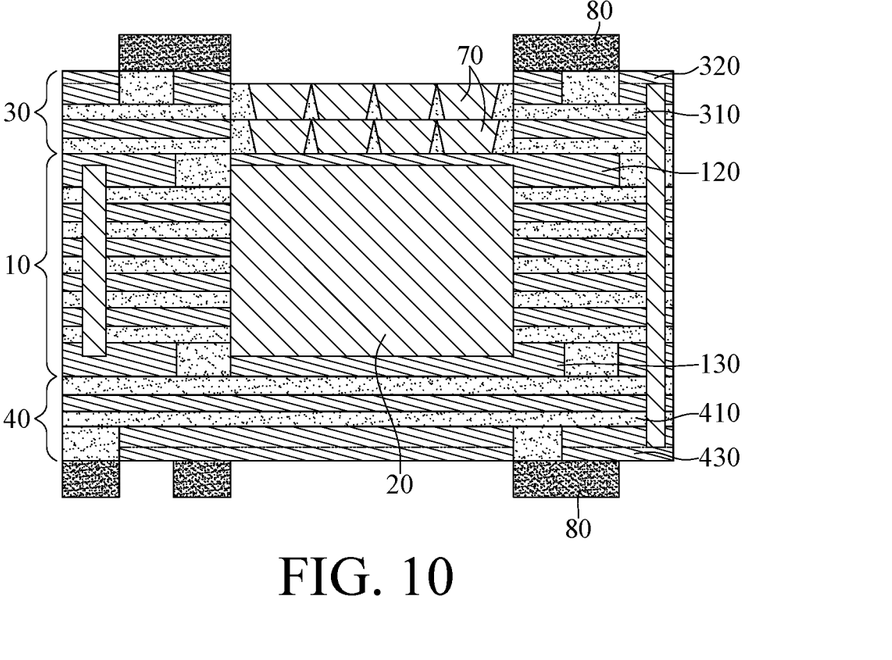

As shown in FIG. 10, the solder masks 80 are formed on the top layer 30 and the bottom layer 40, respectively. In this embodiment, dry film ink or liquid ink is printed on the top layer 30 and the bottom layer 40 with determined pattern. The solder mask 80 is applied to the top circuit pattern 320 and the bottom circuit pattern 430 for protection against oxidation and to prevent solder bridge between closely spaced solder pads or circuit traces. It is worth noting that the solder mask 80 is an optional element in the multilayer PCB structure 1b.

Figure 11:
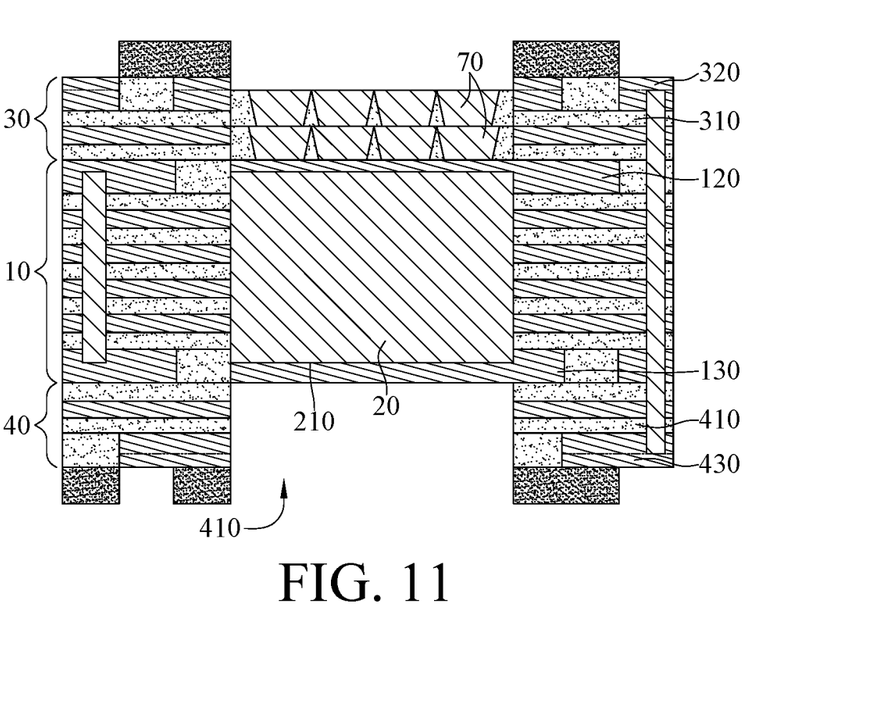

As shown in FIG. 11, part of the bottom layer 40 is removed to form the window 410 exposing part of the bottom circuit pattern 130 of the core layer 10 below the thermally conductive material 20, and thereby defining a heat transfer region 210 corresponding to the bottom surface of the thermally conductive material 20. In this embodiment, the bottom layer 40 is etched to form the window 410 extending from the outmost surface of the bottom circuit pattern 430 of the bottom layer 40 to the bottom circuit pattern 130. The heat transfer region 210 defined by the window 410 may correspond to entire bottom surface of the thermally conductive material 20 or partial bottom surface of the thermally conductive material 20. The size of the heat transfer region 210 may depend on the area of the bottom circuit pattern 130 exposed by the window 410.

Figure 12:
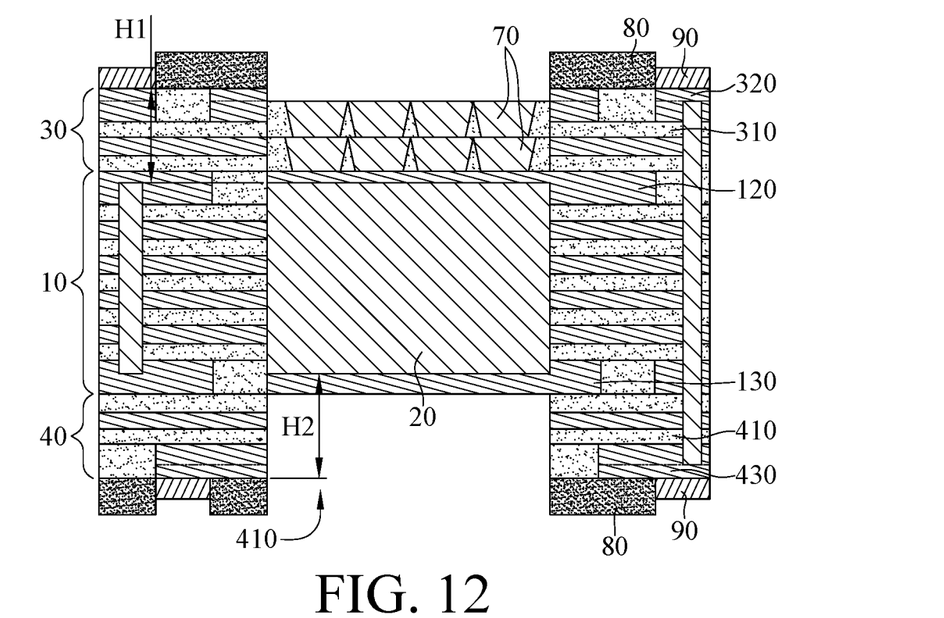

As shown in FIG. 12, the metal film 90 (such as gold) is deposited on the outmost surface of the top circuit pattern 320 of the top layer 30, the bottom circuit pattern 130 of the core layer 10 and the outmost surface of the bottom circuit pattern 430 of the bottom layer 40. It is worth noting that the metal film 90 is an optional element in the multilayer PCB structure 1b.

In this embodiment, a vertical distance H1 between the thermally conductive material 20 and the outmost surface of the top layer 30 is substantially equal to a vertical distance H2 between the thermally conductive material 20 and the outmost surface of the bottom layer 40.

Figure 13:
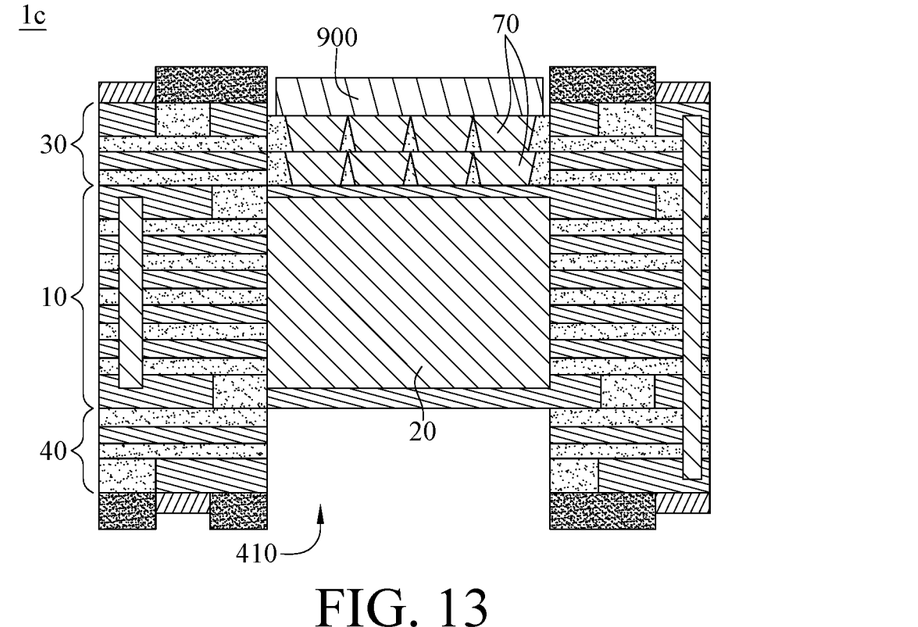
FIG. 13 is a schematic view of an optical communication module according to still another embodiment of the present disclosure.

The thermally conductive material 20 can be provided as a heat spreader. FIG. 13 is a schematic view of an optical communication module according to still another embodiment of the present disclosure. An optical communication module 1c includes the multilayer PCB structure 1b and a heat source 900. The heat source 900 may be a vertical cavity surface emitting laser (VCSEL), a photodiode or an IC chip electrically connected to the top circuit pattern 320 by wire bonding. The thermal via 70 is in thermal contact with the core layer 10, and the heat source 900 is in thermal contact with the thermal via 70.

The heat source 900 is disposed on the top layer 30, and the window 410 for exposing the core layer 10 is formed by removing part of the bottom layer 40 in this embodiment. However, it is worth noting that the scope of present disclosure is not limited by this configuration. In some embodiments, the heat source is disposed on the bottom layer; in such a case, one or more thermal via are formed in the bottom layer.

Compared to the conventional multilayer PCB structure, the thermally conductive material 20 of the multilayer PCB structure 1b is located in the core layer 10, instead of extending to the outmost surface of the top layer 30 or the bottom layer 40. Therefore, it is helpful to prevent unexpected electrical connection between the thermally conductive material 20 and the wire for bonding, such that the outmost surface of the top layer 30 or the bottom layer 40 enjoys a large amount of area for PCB wiring, and the size of the thermally conductive material 20 can be increased without any restriction by the size of the heat source 900.

Moreover, the thermally conductive material may slightly deform due to temperature variation, and some solder paste is needed to fill a cavity formed by the deformation of thermally conductive material in the conventional multilayer PCB structure, while the solder paste has lower thermal conductivity than the thermally conductive material. As to the multilayer PCB structure 1b, the thermal via 70 is provided to achieve the thermal contact between the heat source 900 and the thermally conductive material 20. The thermal via 70 can be selected from metal material with high thermal conductivity or the same material as the thermally conductive material 20, such that it helps heat dissipation efficiency.

Figure 14:
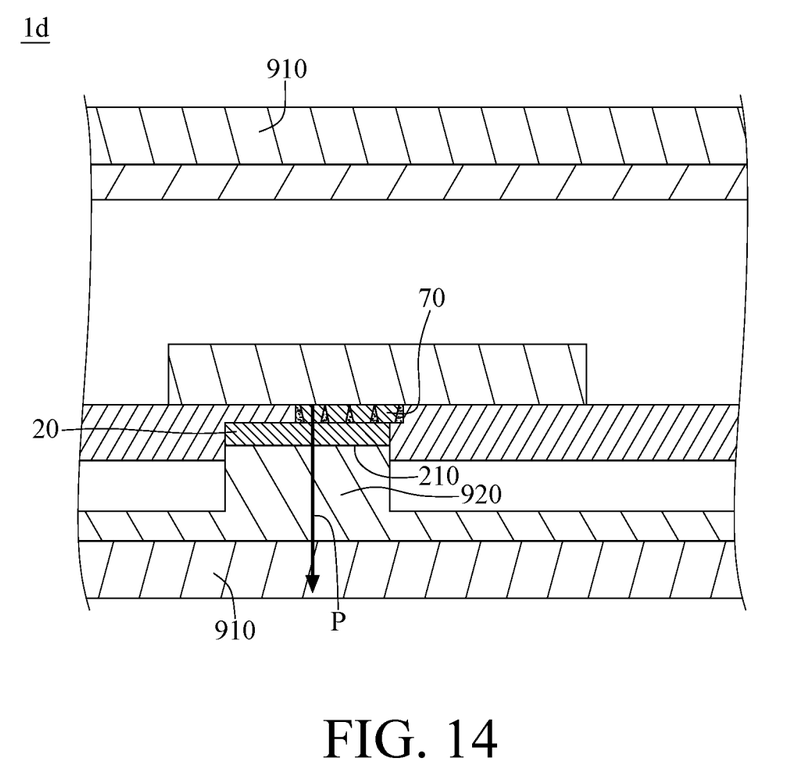
FIG. 14 is a cross-sectional view of an optical transceiver according to yet another embodiment of the present disclosure.

FIG. 14 is a cross-sectional view of an optical transceiver according to yet another embodiment of the present disclosure. An optical transceiver 1d may include a housing 910 and the optical communication module 1c accommodated in the housing 910. The heat transfer area 210 on the bottom surface of the thermally conductive material 20 can be in thermal contact with a heat sink 920 in the housing 910. A heat transfer path from the heat source 900 to the housing 910 is shown in FIG. 14. The heat source 900 generates heat during its operation, and such heat is transferred through the thermally conductive material 20 and the heat sink 920 to reach the housing 910 (referred to the path P).

According to the present disclosure, the thermally conductive material of the multilayer PCB structure is located in the core layer, instead of extending to the outmost surface of the top layer or the bottom layer. Thus, it is helpful to prevent unexpected electrical connection between the thermally conductive material and a wire for bonding on the top layer or the bottom layer. The outmost surface of the top layer and/or the bottom layer enjoys a large amount of area for PCB wiring, and the size of the thermally conductive material can be increased without any restriction by the size of the heat source.

Moreover, the thermal via is provided to achieve the thermal contact between the heat source and the thermally conductive material. The thermal via can be selected from metal material with high thermal conductivity or the same material as the thermally conductive material, such that it helps heat dissipation efficiency.

The embodiments are chosen and described in order to best explain the principles of the present disclosure and its practical applications, to thereby enable others skilled in the art to best utilize the present disclosure and various embodiments with various modifications as are suited to the particular use being contemplated. It is intended that the scope of the present disclosure is defined by the following claims and their equivalents.

What is claimed is:

1. A method of fabricating multilayer printed circuit board (PCB) structure, comprising: forming an empty space in a core layer; forming a thermally conductive material in the empty space; forming a circuit pattern of the core layer, wherein the circuit pattern comprises one of the first surface and the second surface of the core layer, the circuit pattern covers the thermally conductive material, and an area of the circuit pattern at the heat transfer region of the thermally conductive material is exposed by removal of the second layer; forming a first layer on a first surface of the core layer and a second layer on a second surface of the core layer, wherein the first surface and the second surface of the core layer are opposite to each other; and removing part of the second layer corresponding the thermally conductive material to expose the core layer as a heat transfer region of the thermally conductive material; forming a thermal via in the first layer, wherein the thermal via is in thermal contact with the thermally conductive material through the circuit pattern of the core layer.

2. The method according to claim 1, further comprising: forming a solder mask on one of the first layer and the second layer.

3. The method according to claim 1, further comprising: forming a conductive via in the core layer, wherein the thermally conductive material and the conductive via have substantially same thickness.

4. The method according to claim 1, further comprising: forming a conductive via extending through the core layer and into the first layer and the second layer.

5. The method according to claim 1, wherein the first layer and the second layer have substantially same thickness.

6. A multilayer PCB structure, comprising: a core layer; a first layer on a first surface of the core layer; a second layer on a second surface of the core layer, wherein the first surface and the second surface of the core layer are opposite to each other, and a window is formed on the second layer by removing part of the second layer; and a thermally conductive material in the core layer, wherein the window of the second layer exposes part of the core layer below the thermally conductive material; and a thermal via in the first layer, wherein the thermal via is in thermal contact with the thermally conductive material through the core layer.

7. The multilayer PCB structure according to claim 6, wherein a vertical distance between the thermally conductive material and an outmost surface of the first layer is substantially equal to a vertical distance between the thermally conductive material and an outmost surface of the second layer.

8. The multilayer PCB structure according to claim 6, further comprising a conductive via in the core layer, wherein the thermally conductive material and the conductive via have substantially same thickness.

9. The multilayer PCB structure according to claim 6, further comprising a conductive via passing through the core layer, wherein the conductive via extends into the first layer and the second layer.

10. An optical communication module, comprising: the multilayer PCB structure according to claim 6; and a heat source in thermal contact with part of the core layer below the thermally conductive material.

11. The optical communication module according to claim 10, further comprising a thermal via in the first layer of the multilayer PCB structure, wherein the thermal via is in thermal contact with the core layer, and the heat source is in thermal contact with the thermal via.

12. The optical communication module according to claim 10, wherein the heat source is a vertical cavity surface emitting laser, a photodiode or an IC chip.

* * * * *